(12) United States Patent
van Osten et al.

(10) Patent No.: US 7,717,987 B2
(45) Date of Patent: May 18, 2010

(54) COATING MATERIAL BASED ON A COPPER-INDIUM-GALLIUM ALLOY, IN PARTICULAR FOR THE PRODUCTION OF SPUTTER TARGETS, TUBULAR CATHODES AND THE LIKE

(75) Inventors: Karl-Uwe van Osten, Allersberg (DE); Stefan Britting, Schnaittach (DE)

(73) Assignee: GfE Metalle und Materialien GmbH, Nürnberg (DE)

( * ) Notice: Subject to any disclaimer, the term of this patent is extended or adjusted under 35 U.S.C. 154(b) by 15 days.

(21) Appl. No.: 11/943,003

(22) Filed: Nov. 20, 2007

(65) Prior Publication Data
US 2008/0121137 A1 May 29, 2008

(30) Foreign Application Priority Data
Nov. 23, 2006 (DE) .................... 10 2006 055 662

(51) Int. Cl.
*H01L 21/00* (2006.01)
(52) U.S. Cl. ............... 106/1.18; 204/298; 204/192; 438/95; 438/93; 438/63
(58) Field of Classification Search ............... 106/1; 438/95; 204/298
See application file for complete search history.

(56) References Cited

U.S. PATENT DOCUMENTS

| 5,985,691 | A | * | 11/1999 | Basol et al. | ............... 438/95 |
| 6,682,636 | B2 | * | 1/2004 | Mohan et al. | ............ 204/298.13 |
| 2005/0183768 | A1 | * | 8/2005 | Roscheisen et al. | ......... 136/263 |
| 2007/0004078 | A1 | * | 1/2007 | Alberts | .................. 438/95 |

FOREIGN PATENT DOCUMENTS

| CN | 20060111 | * | 1/2006 |
| DE | 698 35 851 T2 | | 4/2007 |
| DE | 69835851 | * | 4/2007 |
| EP | 0 308 201 A1 | | 3/1989 |
| EP | 0308201 | * | 3/1989 |

* cited by examiner

*Primary Examiner*—Melvin C Mayes
*Assistant Examiner*—Colette Nguyen
(74) *Attorney, Agent, or Firm*—McGlew and Tuttle, P.C.

(57) ABSTRACT

The copper-indium-gallium (CuInGa) alloy is in particular to be used for the production of sputter targets, tubular cathodes and similar coating material sources. It has a phase corresponding to a $Cu_5Zn_8$ prototype phase in which the lattice sites of the zinc atoms (Zn) are occupied by gallium atoms (gallium-substituted $Cu_5Zn_8$ phase) and in which indium is simultaneously introduced into the elementary cell or phase, making up a proportion of up to 26 wt %.

9 Claims, 5 Drawing Sheets

COATING MATERIAL BASED ON A COPPER-INDIUM-GALLIUM ALLOY, IN PARTICULAR FOR THE PRODUCTION OF SPUTTER TARGETS, TUBULAR CATHODES AND THE LIKE

BACKGROUND OF THE INVENTION

1. Field of the Invention

The invention relates to a coating material based on a copper-indium-gallium (CuInGa) alloy, in particular for the production of sputter targets, tubular cathodes and similar coating material sources.

2. Background Art

The production of a CuInGa alloy by ingot metallurgy is in principle known from DE 698 35 851 T2. The composition of the alloy mentioned there substantially equals those of the invention disclosed in the following. EP 0 308 201 A1 relates to a sputter target to be used in the production process of magneto-optical recording media. Correspondingly, U.S. Pat. No. 6,682,636 B2 discloses PVD targets and methods of producing them. However, neither of the two disclosures teaches the use of a CuInGa alloy as a coating material.

Field of application is the production of thin-film solar cells with a semiconductor layer consisting of CuInGaSe2 or CuInGaS2 (common abbreviation CIGS). In this process, an electrically conducting CuInGa layer of the desired composition is deposited, e.g. in a vacuum deposition or sputtering process, onto a molybdenum-coated substrate (KNS glass) In a next process step, the layer is selenized or sulphited in a Se- or S-containing atmosphere so as to preserve its semiconducting properties. The CIGS layer is part of a layer system, made up of a layer package, of a thin-film solar cell.

Deposition of the CuInGa layer has so far been carried out by co-evaporation of elementary evaporation sources (Cu, In, Ga separately) or by vapour deposition of alternating layers of binary master alloys from the Cu—In—Ga system. With these processes, however, constant results with regard to the composition of the layers can hardly be obtained over a longer period of time. One problem is for example a lack of Cu during the use of these methods or a non-uniform distribution of the elements used.

Moreover, several steps are often required for depositing the CIG layer since it is impossible to deposit all three elements by sputtering. The melting point of Ga, for example, is 30° C., which inevitably causes the Ga-metal to melt and drip off during the coating process.

Due to the semiconducting properties of this metal, the electrical conductivity is very low. This, in turn, causes the gallium metal to heat up until the molten phase is reached. Consequently, the coating process is disrupted.

The current state of the art allows for sputter targets, both planar and in the shape of a tubular cathode, to be developed by using the three components Cu, In and Ga in order to create the semiconducting CIGS layers; these sputter targets, however, possess a plurality of infavourable material properties and very poor sputtering and layer properties due to an inappropriate conduction of heat during the production of the ternary coating material.

The following are current methods of depositing the CIGS layer onto different substrates:

When the individual elements are vapour deposited simultaneously, both with and without selenium, at different vapour deposition rates and subsequent tempering, the layer reacts to form a semiconducting chalcopyrite structure.

Vapour deposition (Ga)/sputter deposition (In/Cu) of individual layers with subsequent tempering (and selenization), also by using binary metal targets (CuGa+In or CuIn+Ga) of different compositions.

Sputter deposition of the oxide compounds of the three metals with sub-sequent reduction in, for example, H2 to obtain a layer of pure metal.

Layer deposition based on the Se-containing compounds In2Se3, Ga2Se3, In/Ga2Se3 and Cu2Se.

Magnetron sputtering of the direct semiconducting compound materials CuInSe2 or CuInS2. The efficiency of the solar cells thus obtained is too low.

Further methods involving electroplating or screen printing processes for the deposition of the individual layers are still being tested.

A sputter target incorporating the three elements Cu, in and Ga at the desired proportion has not been successfully used in any of the above "conventional" methods of production.

The most common method of producing the CIGS layer on an industrial scale is co-sputtering of targets consisting of CuGa (65-80 wt % of Cu) and In. Selenization occurs in a subsequent tempering step at 500° C. in a Se-containing atmosphere (duration approx. 3 min.).

The advantages of the developed CuInGa targets having the desired compositions lie in the fact that a single sputter target is used in the coating process. This results in higher process stabilities and exactly definable stoichiometries, cost reduction and recyclability of the residual coating materials as well as a necessary high melting temperature of the alloy, especially with regard to the element gallium.

SUMMARY OF THE INVENTION

It is the object of the present invention to provide a coating material which allows for vapour deposition of CIG layers in one single step. By using an evaporation source possessing the correct composition, a high electrical conductivity and a melting point higher than 200° C., this process is reduced to a PVD coating step. The desired composition of the layer is then no longer a problem, selenization may subsequently occur by evaporation, as usual.

This object is attained by the alloy features of a coating material for the production of sputter targets, tubular cathodes and the like, from a copper-indium-gallium (CuInGa) alloy, comprising a phase corresponding to a Cu5Zn8 prototype phase in which the lattice sites of the zinc atoms (Zn) are occupied by gallium atoms (gallium-substituted Cu5Zn8 phase) and in which indium is simultaneously introduced into the elementary cell or phase, making up a proportion of up to 26 wt %.

According to this, the copper-indium-gallium alloy used as coating material has a phase corresponding to a Cu5Zn8 prototype phase in which the lattice sites of the zinc atoms (Zn) are occupied by gallium atoms (gallium-substituted Cu5Zn8 phase), and in which indium is simultaneously injected into the elementary cell or phase, making up a proportion of up to 26 wt %.

Preferably, it is guaranteed that the use of this ternary alloy is applicable for the coating process.

The method of producing the coating material according to the invention incorporates the following process step:

The alloy is produced by ingot metallurgy from the components Cu, In and Ga.

Preferred embodiments of the invention on the one hand refer to a gallium-substituted Cu5Zn8 phase that has a composition with Cu:In:Ga proportions of 59-63:0-25:19-28 wt %. On the other hand, the coating material may have a composition of 34-38 wt % of Cu, 50-54 wt % of In and 10-13 wt % of Ga, preferably 35.8 wt % of Cu, 52.4 wt % of In and 11.83 wt % of Ga.

In principle, it is also possible that based on powder metallurgical production processes of the ternary compound, a gallium-substituted Cu5Zn8 phase with indium injections does not form until during the coating process, i.e. "in statu nascendi". Thus, powder metallurgical processes may be used for the production of CuInGa materials which are produced from either elementary powders or alloy powders of the binary alloys. The powders are mixed corresponding to the desired final composition, and corresponding shaped parts are produced by pressing. With these materials, formation of the required phase in the shape of a thin layer may occur on the target surface or even on the substrate itself.

Surprisingly, with regard to the copper-indium-gallium alloy, it turned out that a defined alloy composition of the ternary system Cu—In—Ga allows for the melting temperature to be increased to temperatures >>200° C., and even up to >400° C. if optimal conditions are provided, by means of a specific conduction of heat without causing the elements Ga and In to selectively melt although the melting temperatures of these elements, with Ga=30° C. and In=156° C., are far below these values.

Detailed phase examinations have shown that the intended formation of intermetallic compounds with simultaneous injection of another, third element into the tetrahedral or octahedral positions thereof allows for the desired effect of a melting temperature increase to be obtained. This is due to the bonding energies generated in this phase, providing for the total number of metallic and covalent bonding components. The possibility of injecting a third element into the compound, said element making up a volume share of at least up to 22 wt %, is an obligatory requirement in this process.

Phase formation with simultaneous injection has previously been unknown in the ternary system Cu—In—Ga and depends in this case on the correct alloy composition, the production parameters and the applied melting process.

Further examinations have shown that due to the geometric requirements of the Cu- and gallium atoms, this newly discovered phase is similar to the known Cu5Zn8 prototype phase, with the Zn-atoms in this particular case being replaced by Ga. A remarkable aspect in this process is that In-atoms are injected into the phase, with indium making up a proportion of up to >22 wt %. It is the formation of this phase that ensures the applicability of the coating material. It is also important in this process that this phase, which has previously been unknown in the literature, has no negative impact whatsoever on the evaporation and sputtering properties of this ternary alloy. This has been proven in several coating experiments.

The $\pi$-phase is thus defined in the ternary Cu—In—Ga alloy system as a phase of the Cu5Zn8 prototype lattice type with simultaneous injections of indium at a proportion of up to >22 wt %, with the indium, as far as X-ray diffractometry is concerned, being unevenly distributed in the present tetrahedral and octahedral positions of the elementary cell of the phase.

Based on the Cu5Zn8 phase prototype, the following literature values are obtained:

| | |
|---|---|
| Temperature (k) | |
| Density | 8,054 g/cm$^3$ |
| Molar volume | 1.04402 cm$^3$/mol |
| Expansion coefficient | 26.90 (10$^{-6}$/k) |
| Specific heat | 387 (J/kg · k) |
| Atom positions | X = 0.313 |
| | Y = 0.313 |
| | Z = 0.036 |
| Volume group | I 43 m |

The $\pi$-phase can thus be defined as a cubic phase system.

BRIEF DESCRIPTION OF THE DRAWINGS

In the following, the invention is described in more detail by means of the enclosed drawings.

DESCRIPTION OF THE PREFERRED EMBODIMENT

When a defined alloy composition and conduction of heat as well as solidification rate are provided, a cubic phase of the Cu5Zn8 prototype phase lattice type is formed in molten CuInGa alloys, with gallium, in this case, occupying the site of the zinc.

Indium is dissolved in this phase at a proportion of up to 22 weight percent (wt %). If the indium concentration exceeds 25 wt %, precipitation occurs, resulting in the formation of the matrix surrounding the above mentioned phase. If the copper concentration exceeds 63 wt %, indium and gallium are either dissolved in Cu or combine with copper to form the following binary compounds:

| | Phase | Stability range in K |
|---|---|---|
| Cu$_2$Ga | $\gamma_1$ | 298-918 |
| Cu$_2$Ga | $\gamma$ | 763-1109 |
| Cu$_3$Ga | $\beta$ | 298-1188 |
| Cu$_5$Ga$_3$ | $\gamma_2$ | 298-758 |
| Cu$_7$Ga$_2$ | $\zeta'$ | 298-595 |
| Cu$_7$Ga$_2$ | $\zeta$ | 603-893 |
| Cu$_7$In$_4$ | $\delta$ | 298-904 |
| Cu$_4$In | $\beta$ | 847-983 |

The binary alloy system InGa does not form phases but a low-melting eutectic mixture at 15° C.

This can be taken from the literature listed below:

"Constitution Of Binary Alloys", Hansen, 2. edition 1958; Metallurgy and Metallurgical Engineering Series.

TAPP Plus Version 2.2; E S Microwave Inc.

Due to the formation of the phase of, in this case, the Cu5Zn8 phase prototype with simultaneous indium injections (in the following referred to as π-phase) and with zinc being substituted by gallium, this results in an increase of the low melting temperatures of the elements gallium, from 302.91 K to temperatures much higher than 502.91 K, and indium, from 429.15 K to temperatures higher than 529.15 K. Consequently, the early melting of especially gallium, which is known from non-alloyed ternary alloys, is prevented, which allows for the alloy to be used in PVD coating processes, in particular sputtering processes or other PVD processes. The known binary alloys of copper-gallium and copper-indium at the proportion of the π-phase are so brittle that they cannot be machined at all or only to a very low extent. Since the binary alloys do not possess the required thermal shock resistance either, these binary alloys are not used at all or only to a very limited extent.

The composition of the phase was determined statistically by means of a scanning electron microscope through an EDX analysis. Three metallographic polished sections of different chemical compositions from the CuInGa system were used as samples. Each sample contained the characteristic π-phase. The composition of each polished section was examined on 10 points apparently belonging to the π-phase.

According to this, the composition of the π-phase is as follows:
CuInGa: 59-63:0-25:19-28 wt %

Figure 1:
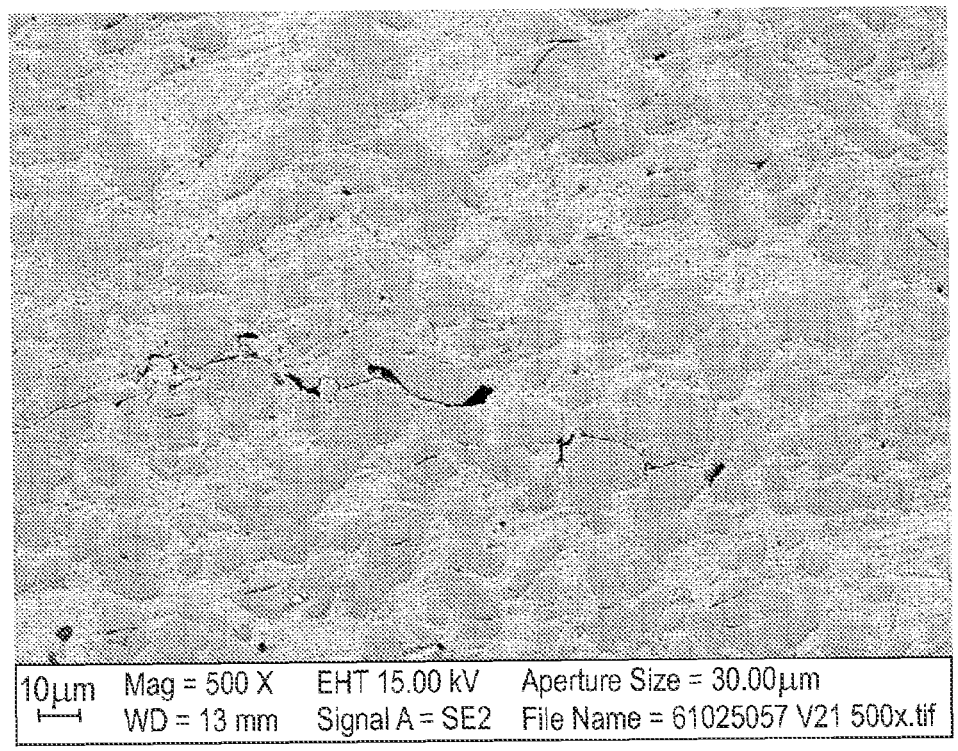
FIG. 1 shows a polished section of a CuInGa 35.8-52.4-11.8 wt % alloy, cooled rapidly.

FIG. 1 shows the polished section of the CuInGa 35.8-52.4-11.8 wt % alloy, cooled rapidly. The π-phase is made up of the dark areas which are surrounded by an indium matrix.

An X-ray phase analysis was performed.

Based on the above data, a molten mass with an average composition of CuInGa 62:17:21 wt % was produced the phase plot of which was determined by means of X-ray diffractometry.

Figure 2:
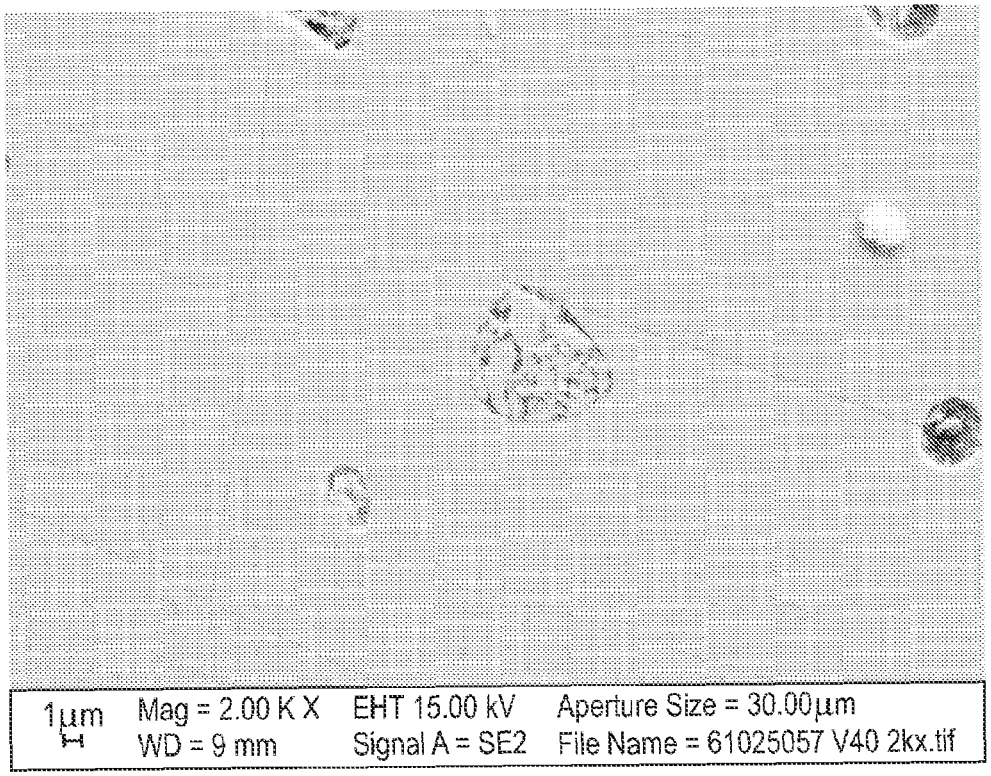
FIG. 2 shows a polished section of a CuInGa 62-17-21 wt % alloy, $\pi$-phase—with casting pores resulting from the applied method.

FIG. 2 shows a polished section of a CuInGa 62-17-21 wt % alloy, π-phase—with casting pores resulting from the applied method.

Figure 3:
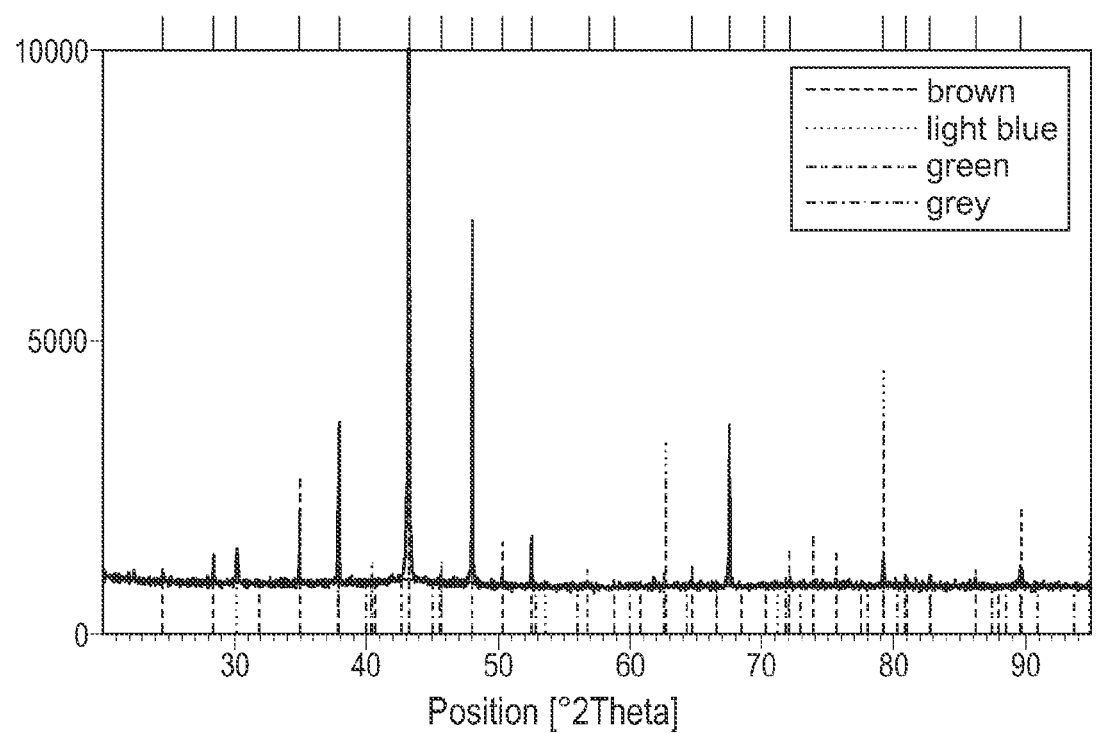
FIG. 3 shows an X-ray spectrum of the $\pi$-phase.

FIG. 3 shows an X-ray spectrum of the π-phase.

Two characteristic peaks of the spectrum, which correspond to the main peak of the Cu5Zn8 prototype phase, can be found at 2 theta angles of 37.9° and 48°. The further reflexes of the Cu5Zn8 prototype phase (brown lines) also correspond to the present spectrum of the π-phase.

Beside the Cu5Zn8 prototype phase, the spectrum also shows elementary copper (grey) and gallium (green) as well as another CuZn phase (light blue), with the Cu5Zn8 prototype phase corresponding most closely to the present π-phase. The reflexes are caused by the lattice distances of the phases present in the sample.

The electrical conductivity has been determined by measuring the volume resistance through several axes of a CuInGa disc the composition of which is shown in FIGS. 1 and 2. The resistance was below the measuring range of the multimeter which is at approx. 300 mΩ. Thus, the material is an excellent conductor of electricity.

Production occurs by ingot metallurgy in an inert gas atmosphere at a pressure of 100-600 mbar. A lower pressure causes the evaporation of too much In and Ga. The melting process takes place in a crucible with the properties:

Thermal conductivity <80 W/mK
Electrical conductivity >0.05 MS/m
Chemical resistance to the molten mass.
Thermal shock resistance.
Cooled indirectly.

The cooling rate is set in a way as to ensure that the crystal size does not exceed 10 µm. Energy transmission may take place through induction, by means of an electric arc or heating elements. The elements Cu, In and Ga as well as all binary or ternary master alloys of this three-element system are used as raw materials.

Figure 4:
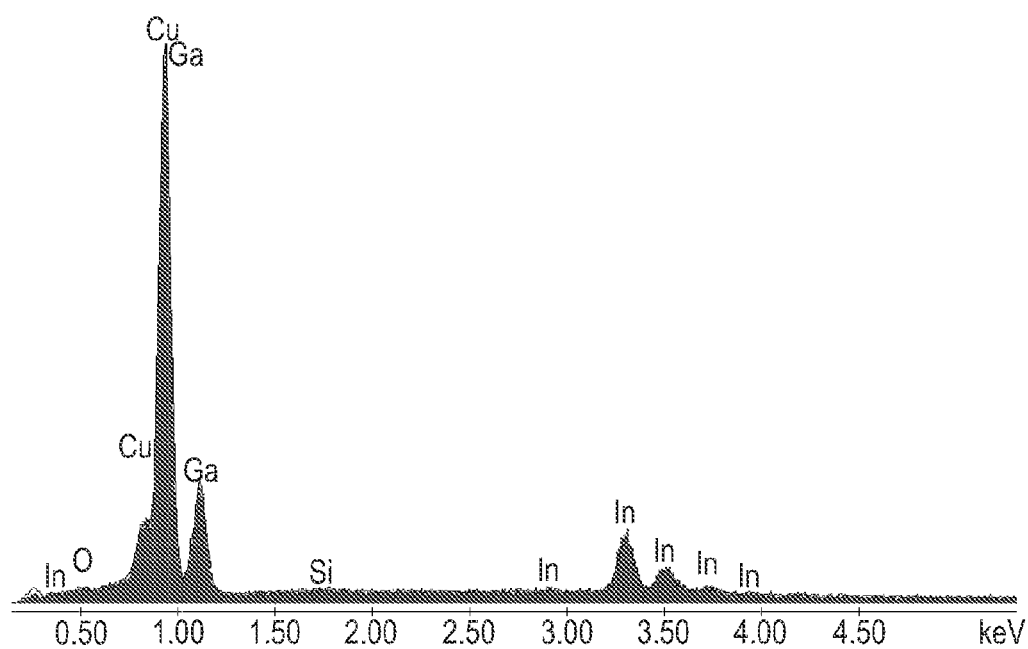
FIG. 4 shows an EDX spectrum for determining the chemical composition of the dark areas ($\pi$-phase) to be seen in FIG. 1.

FIG. 4 shows an EDX spectrum for determining the chemical composition of the dark areas (π-phase) to be seen in FIG. 1.

Figure 5:
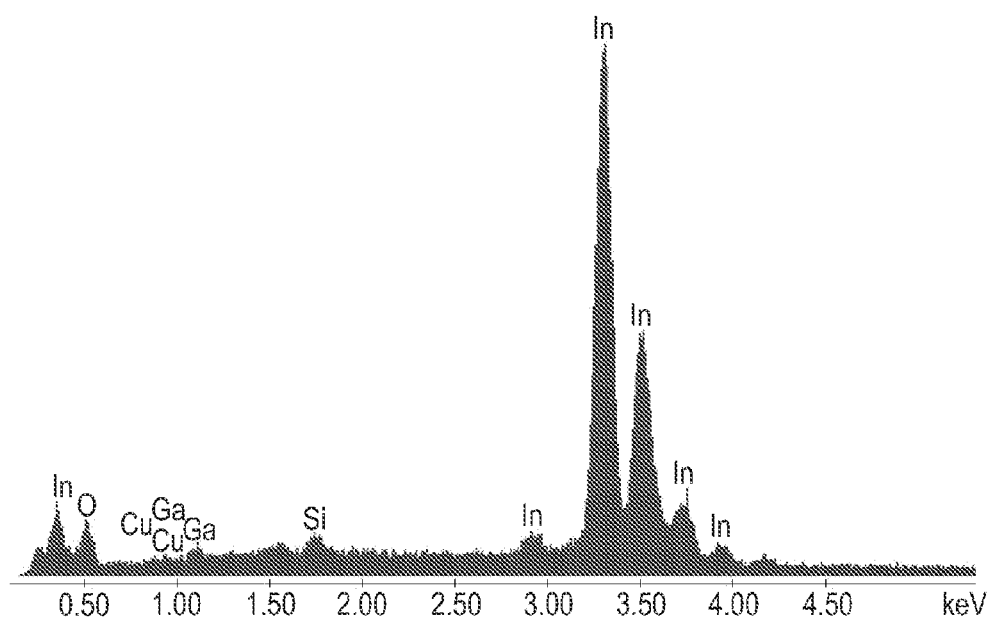
FIG. 5 shows an EDX spectrum of the bright matrix in FIG. 1.

FIG. 5 shows an EDX spectrum of the bright matrix of FIG. 1 which almost exclusively shows indium. The remaining copper and gallium elements are only present as impurities.

Figure 6:
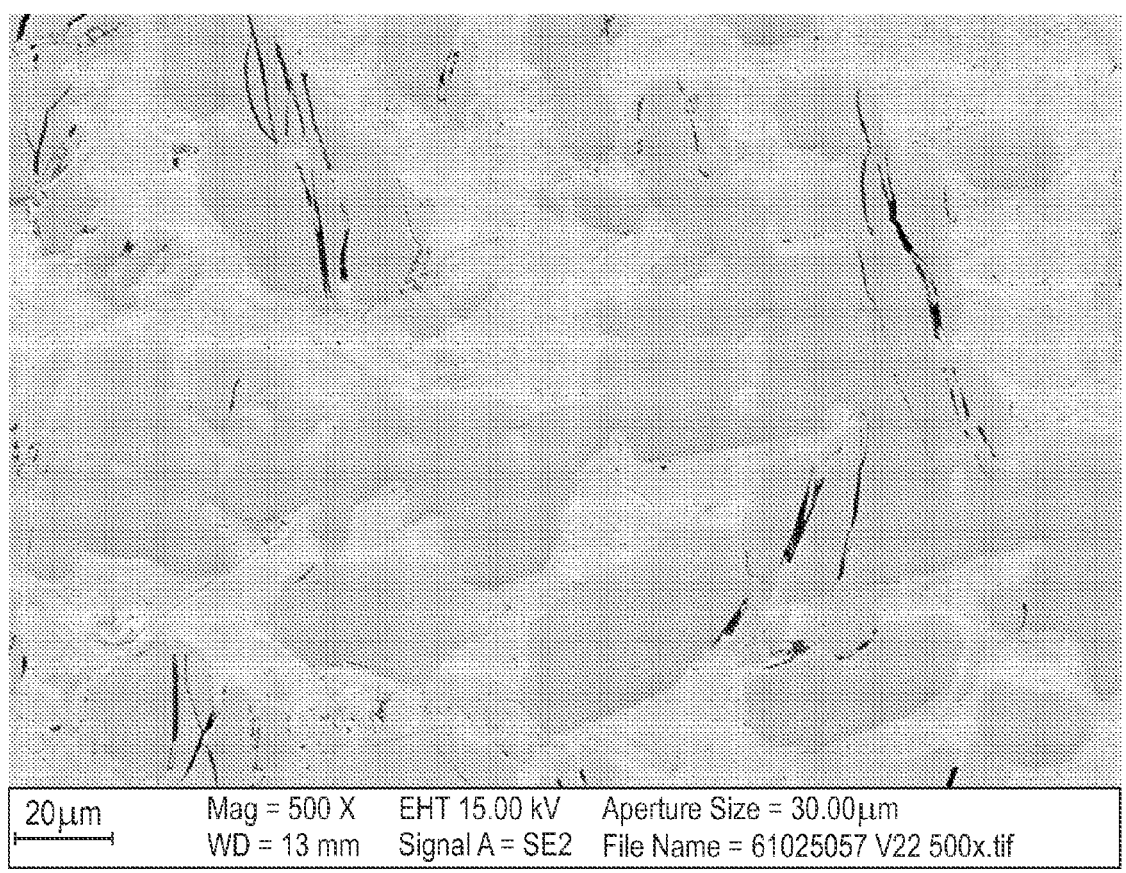
FIG. 6 shows a polished section with a $\pi$-phase when cooled less rapidly.

FIG. 6 shows the π-phase which forms larger grains when cooled less rapidly and becomes susceptible to cracking.

Figure 7:
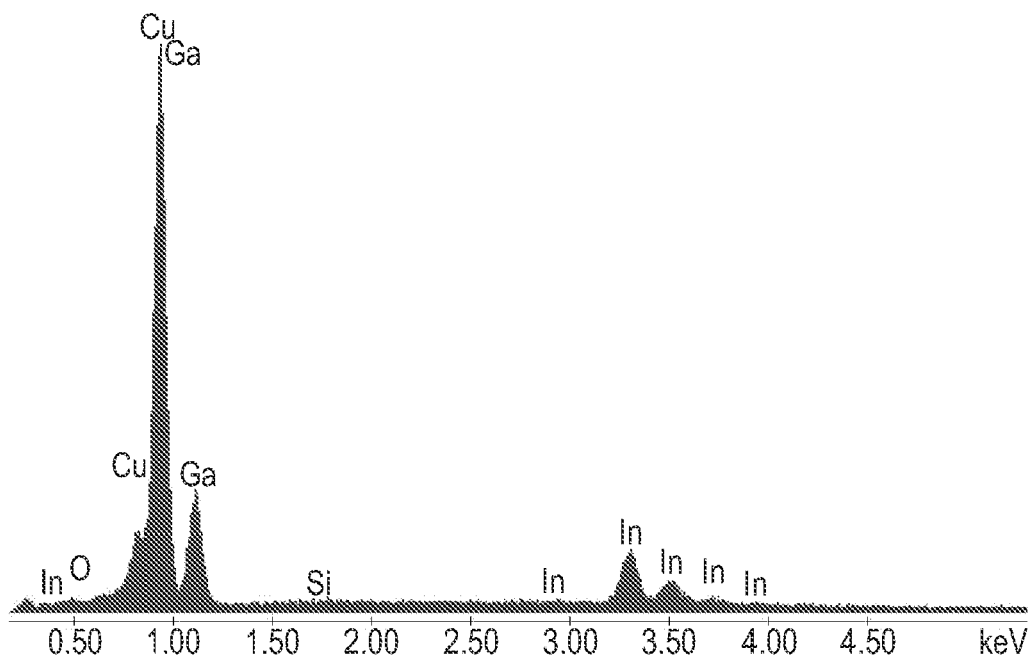
FIG. 7 shows an EDX spectrum of the $\pi$-phase of the slowly cooled molten mass.

FIG. 7 shows the π-phase of the slowly cooled molten mass and has a same EDX spectrum as in FIG. 2.

Figure 8:
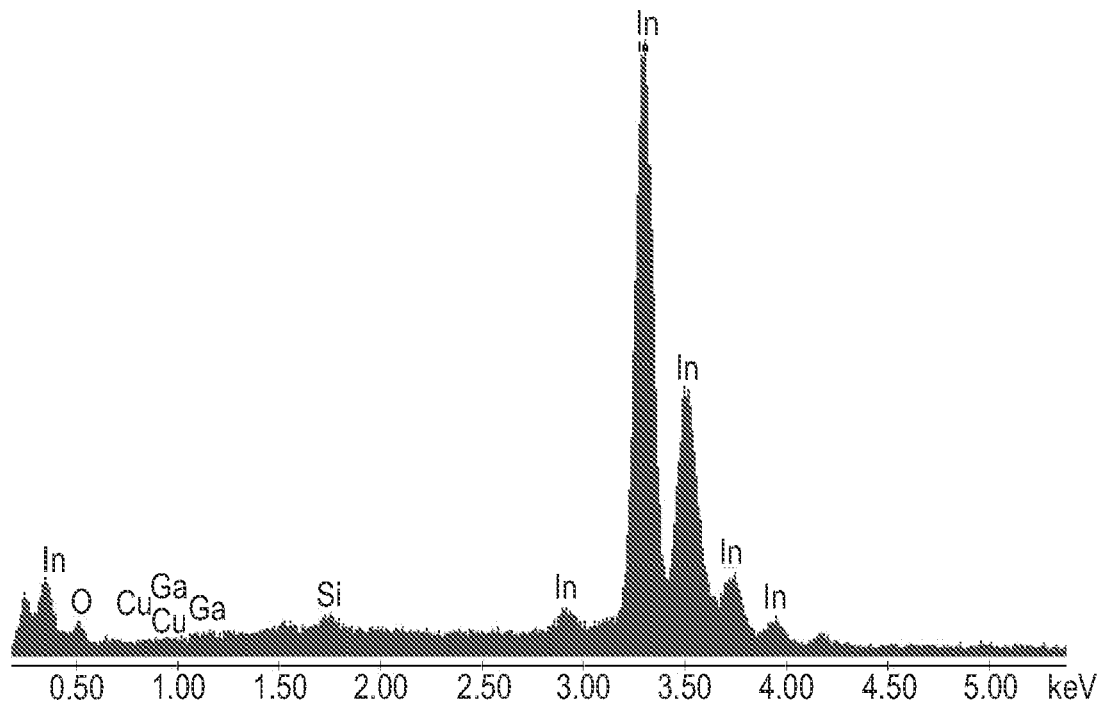
FIG. 8 shows an EDX spectrum of the matrix of the slowly cooled molten mass.

FIG. 8 shows that the matrix of the slowly cooled molten mass again consists almost exclusively of indium.

Figure 9:
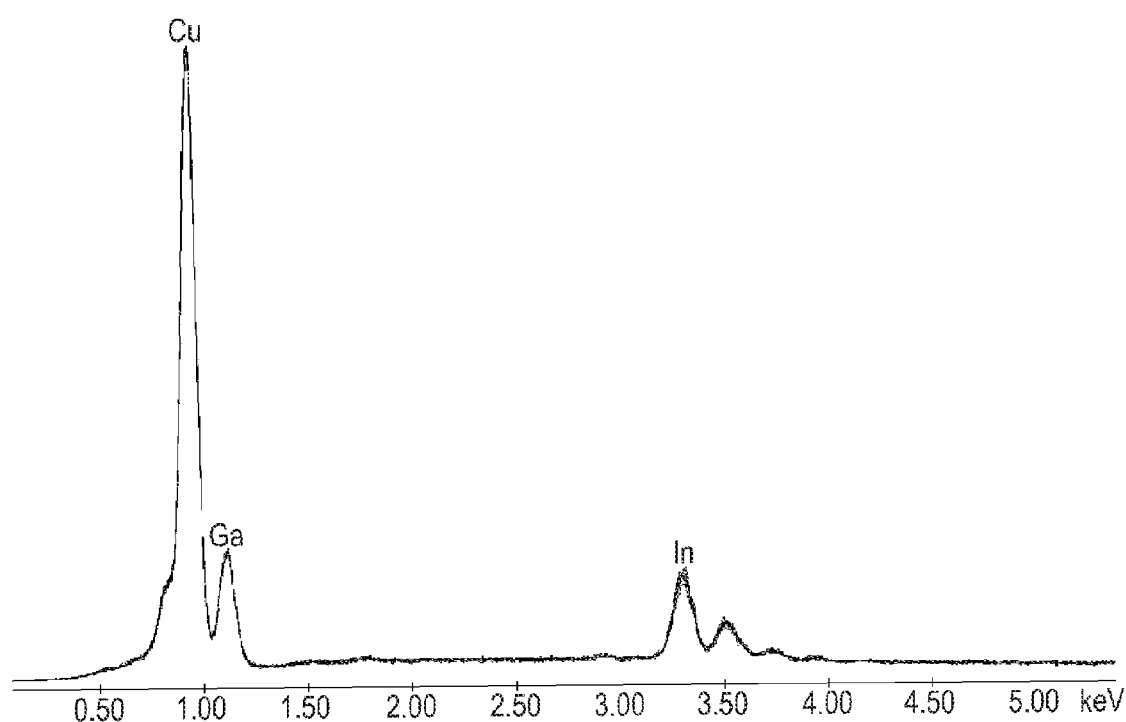
FIG. 9 shows EDX spectra of six examined points on the polished surface of FIG. 2.

The EDX spectra according to FIG. 9 of six points examined on the polished surface of FIG. 2 show the compositions thereof. All points have approximately the same composition.

What is claimed is:

1. A coating source material for use in vapor deposition of CIG layers, in particular for the production of sputter targets, tubular cathodes and the like, consisting of a copper-indium-gallium (CuInGa) alloy, said copper-indium-gallium alloy comprising a phase of a Cu5Zn8 prototype phase type in which the lattice sites of the zinc atoms (Zn) are occupied by gallium atoms (gallium-substituted Cu5Zn8 phase) and in which indium is included in the elementary cell or phase, making up a proportion of up to 26 wt %.

2. A coating material of claim 1, wherein the gallium-substituted Cu5Zn8 phase has a composition with Cu:In:Ga proportions of 59-63:9-25:19-28 wt %.

3. A coating material of claim 1, wherein the copper-indium-gallium alloy comprises a composition of 34-38 wt % of Cu, 50-54 wt % of In and 10-13 wt % of Ga.

4. A coating material of claim 3, wherein the copper-indium-gallium alloy comprises a composition of 35.8 wt % of Cu, 52.4 wt % of In and 11.83 wt % of Ga.

5. A coating source material for use in vapor deposition of CIG layers, in particular for the production of sputter targets, tubular cathodes and the like, consisting of a copper-indium-gallium (CuInGa) alloy, said copper-indium-gallium alloy comprising an indium matrix including a phase of a Cu5Zn8 prototype phase type, in which the lattice sites of the zinc atoms (Zn) are occupied by gallium atoms (gallium-substituted Cu5Zn8 phase) and in which gallium-substituted Cu5Zn8 phase indium is simultaneously included in the elementary cell or phase, making up a proportion of up to 26 wt %.

6. A coating source material for use in vapor deposition of CuInGaSe2 or CuInGaS2 layers, in particular for the production of sputter targets, tubular cathodes and the like, the coating source material consisting of a copper-indium-gallium (CuInGa) alloy, said copper-indium-gallium alloy comprising a gallium-substituted Cu5Zn8 phase, wherein the lattice sites of the zinc atoms (Zn) are occupied by gallium atoms, said gallium-substituted Cu5Zn8 phase including indium, said indium making up a proportion of up to 26 wt % of said gallium-substituted Cu5Zn8 phase.

7. A coating material of claim 6, wherein the gallium-substituted Cu5Zn8 phase has a composition with Cu:In:Ga proportions of 59-63:9-25:19-28 wt %.

8. A coating material of claim 6, wherein the copper-indium-gallium alloy comprises a composition of 34-38 wt % of Cu, 50-54 wt % of In and 10-13 wt % of Ga.

9. A coating material of claim 8, wherein the copper-indium-gallium alloy comprises a composition of 35.8 wt % of Cu, 52.4 wt % of In and 11.83 wt % of Ga.

* * * * *